(12) United States Patent
Saito et al.

(10) Patent No.: US 6,586,262 B1
(45) Date of Patent: Jul. 1, 2003

(54) ETCHING END-POINT DETECTING METHOD

(75) Inventors: Susumu Saito, Kofu (JP); Shinji Sakano, Higashiyatsushiro-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/926,544
(22) PCT Filed: May 17, 2000
(86) PCT No.: PCT/JP00/03167
§ 371 (c)(1), (2), (4) Date: Nov. 16, 2001
(87) PCT Pub. No.: WO00/70668
PCT Pub. Date: Nov. 23, 2000

(30) Foreign Application Priority Data

May 18, 1999 (JP) .......................................... 11-136664

(51) Int. Cl.⁷ .............................................. H01L 21/00
(52) U.S. Cl. .................... 438/9; 156/345.25; 216/60; 216/67; 438/710
(58) Field of Search ................. 438/9, 14, 16, 438/710, 735; 216/60, 67; 156/345.25

(56) References Cited

U.S. PATENT DOCUMENTS 5,980,767 A * 11/1999 Koshimizu et al. ......... 438/9 X

FOREIGN PATENT DOCUMENTS

EP 458324 11/1991

* cited by examiner

Primary Examiner—William A. Powell
(74) Attorney, Agent, or Firm—Oblon, Spivak, McClelland, Maier & Neustadt, P.C.

(57) ABSTRACT

The present invention is a method for end point detection where emission spectra are detected during etching of an object to be processed, such as a semiconductor wafer, by a spectrometer, and an end point of the etching is detected, comprising performing etching of a sample, corresponding to a product, prior to etching of a semiconductor wafer which is the product, sequentially measuring full-spectra of plasma, performing principal component analysis of the emission spectra using the emission intensities of all wavelengths of each of the full-spectra, holding the results as data, thereafter obtaining a principal component score for each of the full-spectra sequentially measured during etching of a semiconductor wafer to be manufactured on the basis of the emission intensities of all the wavelengths, and then detecting an end point of etching on the basis of a substantial change of the principal component score for each of the full-spectra sequentially measured.

6 Claims, 3 Drawing Sheets

US 6,586,262 B1

ETCHING END-POINT DETECTING METHOD

TECHNICAL FIELD

The present invention relates to a method for end point detection of etching in a manufacturing process where etching is performed on an object to be processed using plasma.

BACKGROUND ART

Conventionally, an etching process using plasma has been widely applied to a semiconductor manufacturing process or a LCD substrate manufacturing process.

An etching apparatus therefor is provided in a processing chamber with, for example, an upper electrode and a lower electrode arranged in parallel to each other, in which, while etching gas is being introduced in the chamber, a high frequency voltage is applied between the upper electrode and the lower electrode in a state where an object to be processed (for example, a semiconductor wafer) is placed on the lower electrode to generate plasma in an etching gas atmosphere, thereby performing etching on a surface of the semiconductor wafer.

As a method for end point detection of etching for judging the end of an etching process, there are equipment analysis approaches such as mass spectrometry, emission spectral analysis, and the like, and since emission spectral analysis of plasma is relatively simple and the most sensitive of them, it has been widely employed.

A plasma emission measuring method based on this emission spectral analysis is a method where, from activated species such as radicals, ions or the like such as a decomposition product of an etching gas or a reaction product with the etching gas, attention is paid to a specific species which can be observed most easily and only the emission intensity of the selected species is measured. For example, in a case that a silicon oxide film has been etched using CF group etching gas such as $CF_4$ or the like, a specific wavelength (483.5 nm or the like) of CO* which is a reaction product with the etching gas is detected. Also, when a silicon nitride film is etched using CF group etching gas such as $CF_4$ or the like, a specific wavelength (674 nm or the like) of N* which is a reaction product with the etching gas is detected and an end point is detected on the basis of change points of respective detection intensities. Thus, in the conventional method for end point detection of etching, a wavelength used for the end point detection of etching is changed according to the etching process used.

In a case of the conventional method for end point detection of etching, however, since the end point detection is performed while monitoring only a specific wavelength in emission spectra emitted from plasma, a specific wavelength must have been found for each process.

Furthermore, in an etching process for a low opening etching, i.e., an etching process where the area of a mask pattern occupying a semiconductor wafer is large and an area to be etched is small, since occurrence of the activated species used for an end point detection of etching is reduced and change in emission intensity of a specific wavelength becomes small, there is a problem that the S/N ratio deteriorates so that an exact end point detection of etching becomes difficult.

Also, in U.S. Pat. No. 5,288,367, there has been proposed a method where a specific wavelength of an emission spectrum is automatically determined using an approach of a principal component analysis and an end point of etching is detected on the basis of the specific wavelength.

According to this method, a specific wavelength can automatically be determined, but the method is similar to the conventional method for end point detection of etching regarding the point that the end point of etching is detected using only the specific wavelength.

DISCLOSURE OF INVENTION

An object of the present invention is to provide a method for end point detection of etching where an end point of etching can securely be detected, despite the presence of noise, even in a low opening etching process.

The present invention provides a method for end point detection of etching where, when etching is performed on an object to be processed using plasma, emission spectra are sequentially detected by detecting means and an end point of etching is detected on the basis of change in the emission spectra, comprising: the step of etching a sample in advance prior to etching of the object and sequentially measuring full-spectra of plasma during the etching of the sample; and the step of obtaining weighting factors for each wavelength, where the weighting factors have weighted all wavelengths of each of the full-spectra accumulated until end of etching of the sample according to respective emission intensities of the full-spectra, and further comprising: the step of adding the emission intensities of all the wavelengths for each of full-spectra sequentially measured during etching of the object in addition of the weighting factors; and the step of detecting an end point of the etching on the basis of the degree of change of addition value of the emission intensities for each of the full-spectra sequentially measured. Also, the present invention detects the end point of etching using a differential value of the addition value in the above method for end point detection of etching.

Furthermore, the present invention provides a method for end point detection of etching where, when etching is performed on an object to be processed using plasma, emission spectra are sequentially detected by light detecting means and an end point of etching is detected on the basis of change in the emission spectra, comprising: the step of, prior to etching of the object, etching an object to be processed of the same kind of the object to sequentially measure full-spectra of plasma generated during the etching step; and the step of performing a principal component analysis on all wavelengths of each of full-spectra accumulated until end of etching using respective emission intensities of all the wavelengths; and further comprising the step of obtaining a principal component score on the basis of the respective emission intensities of all the wavelengths and the principal component obtained in the principal component analysis; and the step of detecting an end point of etching on the basis of the substantial change in the principal component score for each of the full-spectral sequentially measured.

Also, in the method for end point detection of etching of the present invention, as the above principal component score, a first principal component score is employed. Furthermore, using the differential value of the principal component score, the end point of etching is detected.

BEST MODE FOR CARRYING OUT OF THE INVENTION

An embodiment of the present invention will be explained below in detail with reference to the drawings.

Figure 1:
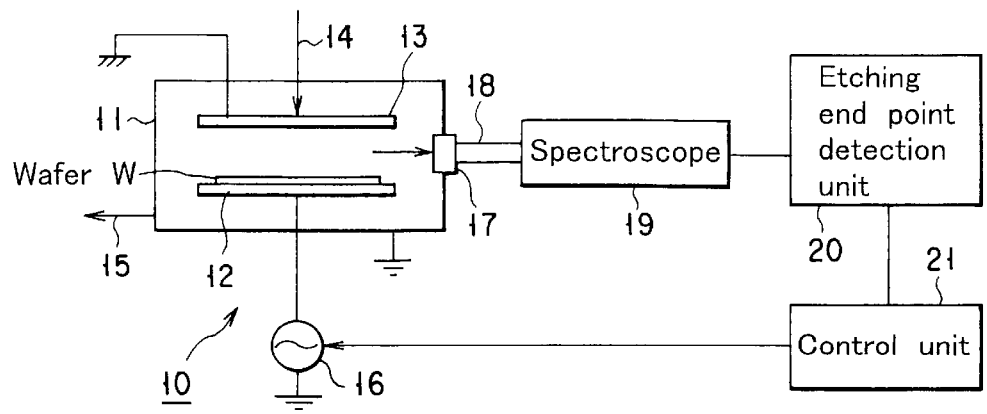
FIG. 1 is a block diagram showing a conceptual configuration of an etching apparatus to which a method for end point detection of etching of an embodiment according to the present invention is applied.

FIG. 1 shows a conceptual configuration of an etching apparatus to which a method for end point detection of etching according to an embodiment of the present invention is applied.

This etching apparatus 10 is provided with a processing chamber 11 made from a conductive material such as, for example, aluminum or the like, a lower electrode 12 which is disposed at a lower portion within the processing chamber 11 and on which an object to be processed (for example, a semiconductor wafer W) can be placed, and an upper electrode 13 which is disposed above the lower electrode 12 so as to be opposed to the lower electrode in parallel thereto.

The upper electrode 13 is formed in a hollow shape for supplying etching gas uniformly, its face opposed to the lower electrode 12 is formed with many holes, and it is electrically grounded.

Then, an upper face of the processing chamber 11 is connected with a gas supplying pipe 14 connected to the upper electrode 13, and etching gas is supplied into the processing chamber 11 from a gas supplying source (not shown) via the gas supplying pipe 14 and the upper electrode 13.

An exhaust pipe 15 connected to an unillustrated exhausting apparatus is connected to a side wall face of the processing chamber 11. The exhausting apparatus exhausts gas from the processing chamber 11 via the exhaust pipe 15 to achieve a desired vacuum degree in the chamber. Of course, the exhaust pipe 15 may be provided to a bottom face of the processing chamber instead of the side wall face thereof.

The lower electrode 12 is connected with a high frequency power supply 16, and a high frequency voltage is applied from the high frequency power supply 16 to the lower electrode 12 to generate plasma between the upper electrode 13 and the lower electrode 12 in an etching gas atmosphere so that a surface of the semiconductor wafer W placed on the lower electrode 12 is etched.

Also, a monitor window 17 made of a transparent body such as a quartz glass or the like is mounted to a portion of the side wall face of the processing chamber 11, emission spectra emitted or discharged from plasma in the processing chamber 11 is captured so that an end point detection of etching is performed on the basis of change of the emission spectrum.

As the configuration for performing the above detection, a polychromator 19 is connected to this window 17 via an optical fiber 18, and the emission spectra captured via the optical fiber 18 are sequentially measured by spectroscope (polychromator) 19 and they are separated into spectral components for each of wavelengths instantaneously so that full-spectra to all the wavelengths are obtained. The polychromator 19 is constituted by, for example, combination of a grating and a diode array or CCD.

Furthermore, the polychromator 19 is connected with an etching end point detection unit 20. As described later, the etching end point detection unit 20 processes spectral data obtained from the polychromator 19 to calculate the result of the end point detection which shows termination of the etching and output the same to a control unit 21. The control unit 21 ON/OFF-controls the output of the high frequency power supply 16.

Figure 2:
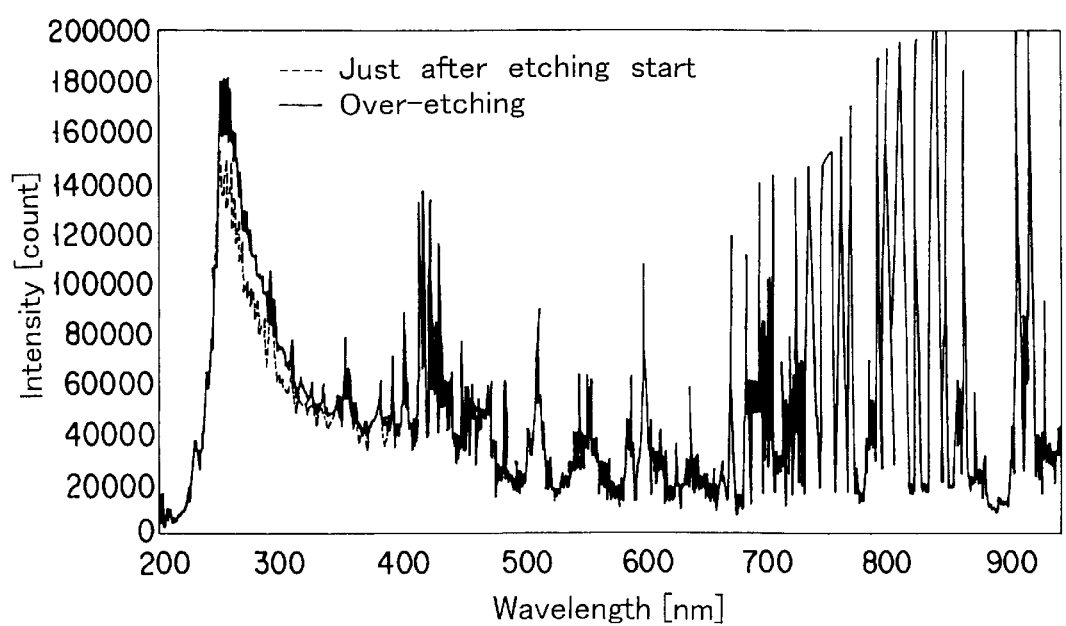
FIG. 2 is a graph showing one example of the emission spectrum measured by a polychromator shown in FIG. 1.

At this time, the measured result and the end point detection result can be displayed on a display device as the emission spectra as shown in FIG. 2 or can be output as a recording paper.

The emission spectrum shown in FIG. 2 has been obtained in an example where a silicon oxide film ($SiO_2$) has been etched, where a dotted line denotes a full-spectrum just after an etching start and a solid line denotes a full-spectrum at a time of over-etching.

FIG. 2 shows a graph where intensities of emission spectrum in a wavelength range of 200 nm to 950 nm have been obtained at 1024 points by the polychromator 19. In this figure, a difference between the solid line and the dotted line appears in the vicinity of the first peak.

The etching end point detection unit 20 is configured so as to analyze the emission spectrum using a multivariate analysis such as, for example, principal component analysis or the like to detect the end point of etching, and this embodiment is configured such that the end point of etching is detected using soft-ware of a principal component analysis.

In a case that the end point of etching is performed using the above principal component analysis approach, a sample wafer (for example, the same one as a semiconductor wafer used as a product in an actual manufacturing step) is etched in advance, full-spectra are sequentially measured from an etching start until over-etching, and respective emission intensities of each wavelength of the full-spectra sequentially measured are accumulated as spectra data for each emission spectrum.

Next, the principal component analysis is performed. Here, the spectral data previously measured is used as variables for the principal component analysis, and the number of measurements of each full-spectrum sequentially measured is used as the sample number of the principal component analysis. A weight in end point detection of each wavelength of the full-spectra is obtained as a characteristic vector according to principal component analysis.

For example, when the i-th wavelength intensity of the emission spectrum measured after t seconds elapsed is defined as Xi(t), and its weighting factor, i.e., each component of the characteristic vector is defined as ai, a principal component Z(t) of the spectral data after t seconds is expressed in the following expression, and the numerical value of the principal component Z(t) is a principal component score.

$$Z(t)=a1X1(t)+a2X2(t)+ \ldots +anXn(t)$$

This equation is an addition value (hereinafter, referred to as spectral intensity) where each wavelength intensity of the emission spectrum is multiplied with its weighting factor of the wavelength. According to increase in the variation of the wavelength intensity Xi(t), the role of the spectral intensity at the end point detection of etching becomes heavier, so that the value of the weighting factor ai becomes large according to such a wavelength.

Accordingly, the principal component score reaches a value where the weight of Xi(t) is reflected, and its change becomes remarkable in the vicinity of the end point of etching. For this reason, the time-variation of the spectral intensity becomes apparent so that judgement about the end point detection of etching is made easy.

In order to obtain the principal component, first, a variance-covariance matrix of each variable of the spectral data obtained by etching the sample wafer is obtained.

Next, a characteristic value and a characteristic vector are obtained on the basis of the variance-covariance matrix. The characteristic value exists corresponding to the number of variables and each characteristic vector exists for each characteristic value.

The principal components obtained from the characteristic vector corresponding to the magnitude order of the characteristic value are obtained as the first principal component, the second component, . . . , the n-th principal component in the magnitude order of the characteristic value. In general, as the degree of the principal component increases, the contribution rate lowers and its utility value is reduced.

In view of the above, in this embodiment, the first principal component which has the highest contribution rate is used for end point detection of etching. The characteristic vector (a1, a2, . . . , an) of the first principal component is calculated using the highest value of the characteristic values, as mentioned above, and it is obtained from each variable of the sample wafer.

Figure 3:
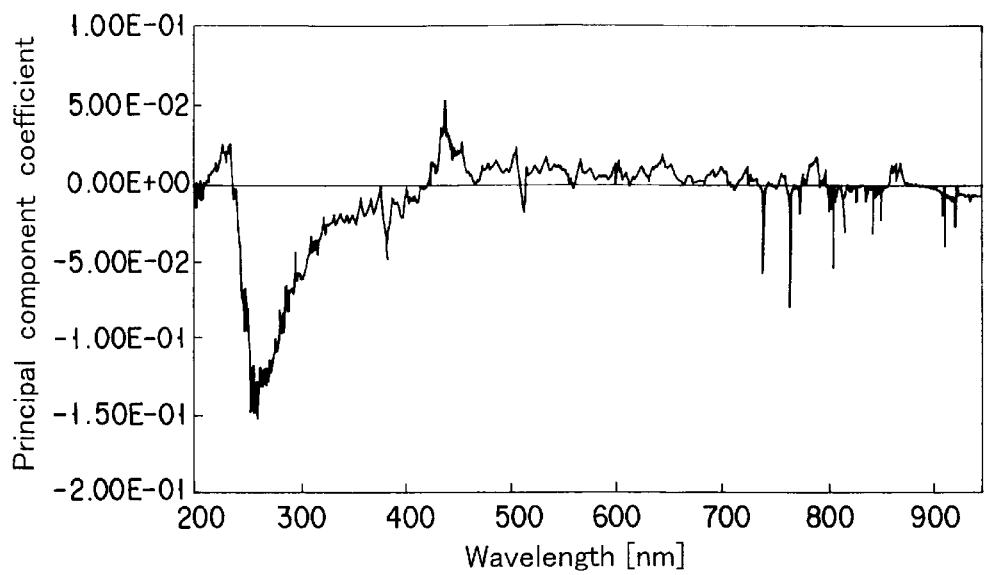
FIG. 3 is a graph showing the coefficient of a first principal component (natural vector) corresponding to each wavelength of the emission spectra shown in FIG. 2.

For example, each coefficient of the first principal component corresponding to the full-spectrum of the emission spectrum shown in FIG. 2 varies to a minus side and a plus side to produce a plurality of peaks, as shown in FIG. 3, so that the weight of each variable of the first principal component can be clearly known.

In FIG. 3, a plurality of large peaks can be recognized and a plurality of coefficients can be utilized for end point detection of etching so that a specific wavelength which can be utilized for an end point detection of etching can easily be found. When tracking is performed utilizing the wavelength corresponding to this peak as the specific wavelength, an end point detection of etching similar to the conventional one can be performed. However, when tracking of only the specific wavelength has been performed, there occurs a case that the S/N ratio deteriorates and the end point can not be detected, as mentioned above.

In the present embodiment, the spectral intensity obtained by summing all the wavelength intensities of the full-spectrum in addition to the respective weighting factors (characteristic vectors) is obtained as the first principal component score, the end point detection of etching is performed on the basis of the change of the first principal component score.

That is, after the first principal component, namely Z(t) characteristic vector (a1, a2, . . . , an) is obtained from the spectral data of a sample wafer prior to etching of an actual semiconductor wafer, as mentioned above, full-spectra are sequentially measured during an actual etching by the polychromator 19. Each wavelength intensity of the full-spectra measured is substituted for the variables X1(t), X2(t) . . . Xn(t) to obtain the first principal component score for each measurement.

Noise in the emission spectrum is ordinarily produced regardless of the state of etching, but the influence of such noise can be reduced by using principal component analysis. Accordingly, an end point detection of etching which is not affected by noise can be performed.

Figure 4:
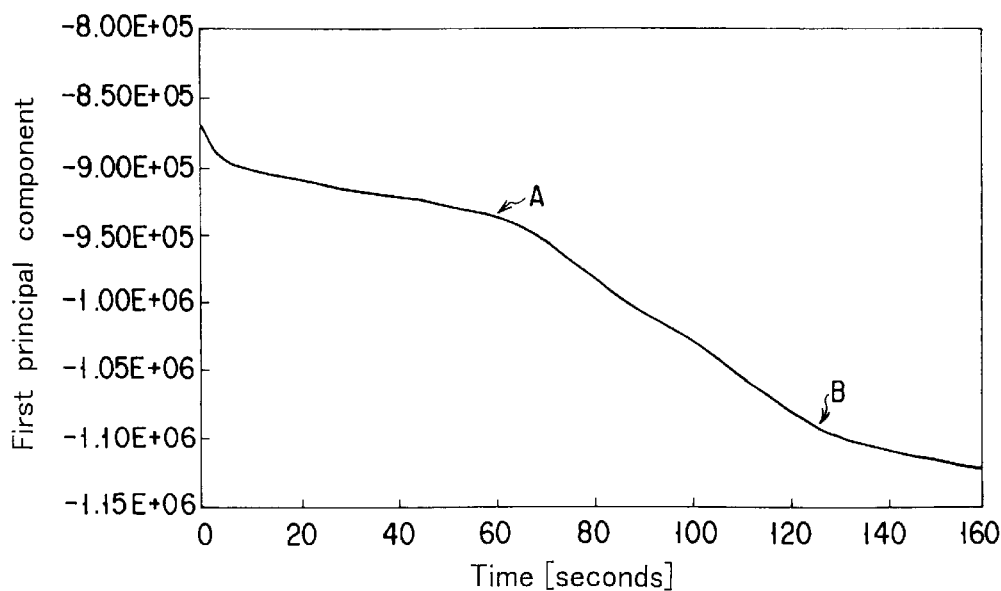
FIG. 4 is a graph showing a time-variation of a first principal component score of the emission spectra shown in FIG. 2.

When the secular change of the above-mentioned first principal component score is observed from an etching start, the score changes, for example, as shown in FIG. 4. According to FIG. 4, the first principal component gently decreases until 60 seconds or so of arrow A after the etching start, but it rapidly decreases for a time period of 60 seconds to 120 seconds, and then it gently decreases again from a boundary of arrow B exceeding 120 seconds. In this case, it is considered that the material which is being etched has been changed and it can be assumed that the etching has terminated when 120 seconds or so have elapsed after the etching start.

Accordingly, when the slope of change of the first principal component score has been changed twice, the etching end point detection unit 20 judges that the second change point is an end point of etching and it outputs an end point detection signal to the control unit 21. The control unit 21 stops the output of the high frequency power supply 16 to terminate the etching process.

Also, the primary differential values of the first principal component scores are sequentially calculated during the etching process, the end point of etching can be obtained on the basis of the calculation result.

Figure 5:
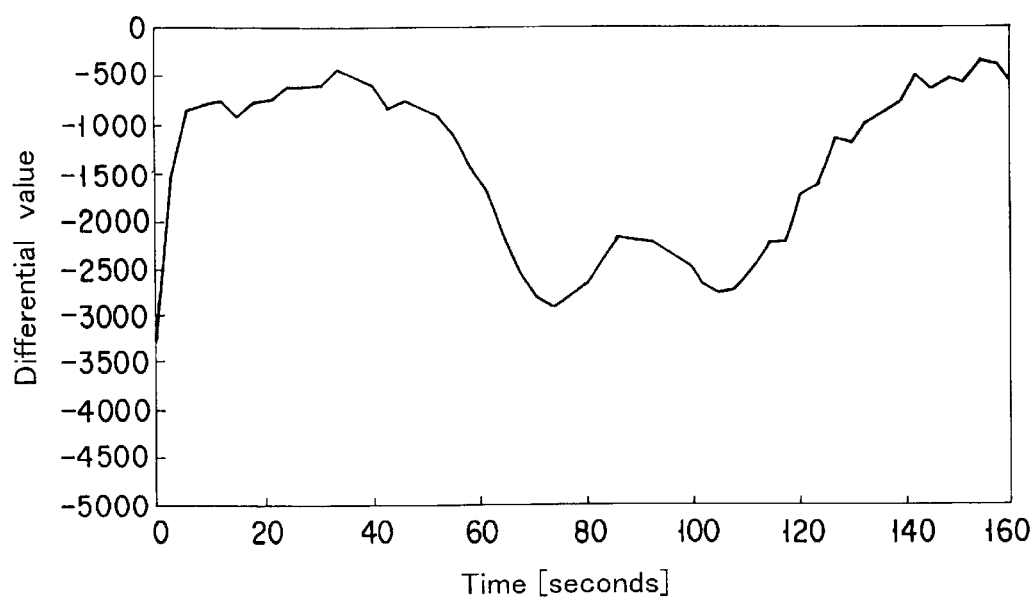
FIG. 5 is a graph showing a time-variation of a primary differential value of the first principal component score shown in FIG. 4.

As apparent from FIG. 5, also, the primary differential value varies largely in a section from 60 to 120 seconds shown in FIG. 4, in which an end point detection of etching can be made easier than the case shown in FIG. 4.

As mentioned above, according to the present embodiment, using a sample wafer in advance, a principal component analysis of its semiconductor wafer is performed to obtain the characteristic vector of the first principal component.

Thereafter, when the semiconductor wafer is etched, full-spectra of emission spectra are sequentially measured, and each wavelength intensity of the full-spectra is substituted for the variable of the first principal component to calculate the first principal component score.

Such a configuration is employed that the variation of the first principal component score thus calculated is tracked to detect the end point of etching, the spectral intensity can be obtained by weighting a plurality of wavelengths useful for detection of an end point of etching, respectively, so that, even in a low opening etching, the end point of etching can be made apparent and the end point can easily and securely be detected (refer to FIG. 4).

Also, since noise in the full-spectra can be virtually ignored in the first principal component, the end point detection of etching can be performed using the first principal component score (spectral intensity) in a state where noise is reduced and the detection is hardly affected by the noises.

Furthermore, by obtaining the characteristic vector of the first principal component, a wavelength which can be utilized for an end point detection of etching can easily be found (refer to FIG. 3).

Also, according to the present embodiment, by obtaining the primary differential value of the first principal component score, the end point of etching can more securely and easily be detected (refer to FIG. 5).

Incidentally, in the above embodiment, the end point detection of etching of a semiconductor wafer which is conducted using the principal component analysis has been explained, but it can be performed using another multivariatable analysis approach. Also, the present invention is applicable to an object to be processed such as a LCD substrate or the like other than the semiconductor wafer.

That is, any method for end point detection of etching comprising: the steps of sequentially measuring full-spectra of plasma using a sample prior to an actual etching of an object to be processed; the step of weighting all wavelengths of respective full-spectra accumulated until the termination of etching according to their emission intensities of full-spectra to obtain a weighting factor for each wavelength; and further comprising the step of adding the emission intensities of all the wavelengths for each of the full-spectra sequentially measured during an actual etching in addition of respective weighting factors; and the step of detecting an end point of etching on the basis of a substantial change of an additional value of the emission intensities for each of the full-spectra sequentially measured can be included in the present invention.

As explained above, according to the present invention, since the end point of etching is detected using the full-spectra, it is unnecessary to rearrange a spectroscope so as to correspond to a specific spectrum each time when an etching process is changed, and a method for end point detection of etching where, even in a low opening etching, an end point of etching can securely be detected in a state where the detection is hardly affected by noise can be provided.

INDUSTRIAL APPLICABILITY

The present invention is a method utilized for an end point detection of etching in an etching processing step used for a semiconductor manufacturing technique.

This method for end point detection of etching is a method based on changes in an emission spectrum during etching, comprising: sequentially measuring full-spectra of plasma in a sample in advance by a polychromator prior to an actual etching processing of an object to be processed; performing principal component analysis of emission spectra using emission intensities of all wavelengths of each full-spectra to obtain weighting factor data; thereafter obtaining main component scores added with respective weighting factor data for the full-spectra sequentially measured during an actual etching; and then detecting an end point of etching on the basis of the degree of change of these principal component scores.

What is claimed is:

1. A method for end point detection of etching where, when an object to be processed is etched using plasma, emission spectra of plasma are sequentially measured by light detecting means, an end point of etching is detected on the basis of change of the emission spectra, comprising:

the step of etching a sample (the same kind as the following object to be processed) of the object prior to etching the object to sequentially measure full-spectra of plasma during the etching; and the step of obtaining weighting factors for each wavelength, the weighting factors weighting all wavelengths of each full-spectrum accumulated until an etching end of the sample according to respective emission intensities, and further comprising;

the step of adding the emission intensities of all the wavelengths for each of the full-spectra sequentially measured during etching of the object in addition with the respective weighting factors; and the step for an end point detection of etching of detecting an end point of etching on the basis of the degree of change of an additional value of the emission intensities for each of full-spectra sequentially measured.

2. A method for end point detection of etching according to claim 1, wherein the degree of the change of the additional value in the step for an end point detection of etching is judged on the basis of a differential value of the additional value and a time point at which the differential value changes most largely is detected as an end point of etching.

3. A method for end point detection of etching according to claim 2, wherein, in the degree of the change of the additional value in the step for an end point detection of etching, when large changes of the differential value of the additional value are observed at two points, the time of the change in the latter half is detected as the end point of etching.

4. A method for end point detection of etching where, when an object to be processed is etched using plasma, emission spectra of plasma are sequentially measured by light detecting means, an end point of etching is detected on the basis of change of the emission spectra, comprising:

the step of etching a sample (the same kind as the following object to be processed) of the object prior to etching the object to sequentially measure full-spectra of plasma during the etching; and the step of using emission intensities of all wavelengths of each of full-spectra sequentially measured during etching of the object to perform a main component analysis, and further comprising:

the step of obtaining principal component scores for each of the full-spectra accumulated until the end of etching of the sample on the basis of the emission intensities of all the wavelengths and a principal component expression obtained in the principal component analysis; and the step of detecting the end point of etching on the basis of the degree of change of a principal component score for each of the full-spectra sequentially measured.

5. A method for end point detection of etching according to claim 4, wherein the principal component score is a first principal component score obtained from a characteristic value and a characteristic vector.

6. A method for end point detection of etching according to claim 5, wherein the degree of the change of the additional value in the step for an end point detection of etching is judged on the basis of a differential value of the additional value and a time point at which the slope of the differential value has changed is detected as the end point of etching.

* * * * *